(12) United States Patent
Thallner

(10) Patent No.: US 10,014,202 B2
(45) Date of Patent: Jul. 3, 2018

(54) DEVICE AND METHOD FOR ALIGNING SUBSTRATES

(76) Inventor: Erich Thallner, St. Florian (AT)

( * ) Notice: Subject to any disclaimer, the term of this patent is extended or adjusted under 35 U.S.C. 154(b) by 734 days.

(21) Appl. No.: 14/406,790

(22) PCT Filed: Jun. 12, 2012

(86) PCT No.: PCT/EP2012/061109
§ 371 (c)(1),
(2), (4) Date: Dec. 10, 2014

(87) PCT Pub. No.: WO2013/185803
PCT Pub. Date: Dec. 19, 2013

(65) Prior Publication Data
US 2015/0170950 A1  Jun. 18, 2015

(51) Int. Cl.
| | | |
|---|---|---|
| H01L 21/68 | (2006.01) | |
| H01L 21/67 | (2006.01) | |
| H01L 21/673 | (2006.01) | |
| H01L 21/677 | (2006.01) | |

(52) U.S. Cl.
CPC ........ *H01L 21/68* (2013.01); *H01L 21/67121* (2013.01); *H01L 21/67346* (2013.01); *H01L 21/67736* (2013.01); *H01L 21/681* (2013.01); *H01L 21/682* (2013.01); *Y10T 428/21* (2015.01)

(58) Field of Classification Search
CPC ............... H01L 21/68; H01L 21/67121; H01L 21/67346; H01L 21/67736; H01L 21/681; H01L 21/682; Y10T 428/21
USPC .......................................................... 700/114
See application file for complete search history.

(56) References Cited

U.S. PATENT DOCUMENTS

| | | | |
|---|---|---|---|
| 7,237,606 B2 | 7/2007 | Yuasa et al. | 165/185 |
| 2003/0226633 A1* | 12/2003 | Muramoto | B32B 37/10 156/145 |
| 2004/0188020 A1 | 9/2004 | Yuasa et al. | 156/345.51 |

(Continued)

FOREIGN PATENT DOCUMENTS

| | | | | |
|---|---|---|---|---|
| JP | 2001-284436 | 10/2001 | | H01L 21/68 |
| JP | 2002-373929 | 12/2002 | | C23C 16/458 |

(Continued)

OTHER PUBLICATIONS

Office Action issued in corresponding Japanese Patent Application No. 2015-516478 dated Feb. 12, 2016.

(Continued)

*Primary Examiner* — Kenneth M Lo
*Assistant Examiner* — Sivalingam Sivanesan
(74) *Attorney, Agent, or Firm* — Kusner & Jaffe

(57) ABSTRACT

A device for aligning and bringing a large-area substrate into contact with a carrier substrate comprising: a substrate holding means for attaching the substrate; a carrier substrate holding means for attaching the carrier substrate; detection means for detection of a peripheral contour of the substrate attached to the substrate holding means and detection of a peripheral contour of the carrier substrate attached to the carrier substrate holding means relative to a contact plane of the substrate with the carrier substrate; aligning means for aligning the substrate relative to the carrier substrate; and contacting means for bringing the substrate into contact with the carrier substrate.

15 Claims, 4 Drawing Sheets

(56) References Cited

U.S. PATENT DOCUMENTS

| | | | |
|---|---|---|---|
| 2004/0246795 A1* | 12/2004 | Tomita | H01L 21/76251 |
| | | | 365/200 |
| 2005/0181579 A1 | 8/2005 | Thallner | 438/455 |
| 2006/0292887 A1 | 12/2006 | Hara | 438/753 |
| 2007/0020871 A1 | 1/2007 | Chen et al. | 438/401 |
| 2010/0197187 A1* | 8/2010 | Naraba | G02F 1/1303 |
| | | | 445/25 |

FOREIGN PATENT DOCUMENTS

| | | | | |
|---|---|---|---|---|
| JP | 2003-203965 | 7/2003 | | H01L 21/027 |
| JP | 2006-269915 | 10/2006 | | H01L 21/68 |
| JP | 2007-019457 | 1/2007 | | H01L 21/68 |
| JP | 2011233683 | 11/2011 | | H01L 21/02 |
| JP | 2012-049326 | 3/2012 | | G01B 11/00 |

OTHER PUBLICATIONS

Office Action issued in corresponding Japanese Patent Application No. 2015-516478 dated Jul. 19, 2016.
International Search Report from corresponding International Patent Application No. PCT/EP2012/061109, dated Aug. 9, 2012.
Office Action issued in corresponding Singapore Patent Application No. 2014012942 dated Dec. 22, 2015.

* cited by examiner

DEVICE AND METHOD FOR ALIGNING SUBSTRATES

RELATED APPLICATIONS

This application is a U.S. National Stage of International Application No. PCT/EP2012/061109 filed Jun. 12, 2012.

FIELD OF THE INVENTION

This invention relates to a device for aligning and bringing a large-area substrate into contact with a carrier substrate for the further processing of the substrate as well as a corresponding process.

BACKGROUND OF THE INVENTION

The back-thinning of wafers is often necessary in the semiconductor industry and can be done mechanically and/or chemically. For back-thinning, the wafers are generally temporarily attached to a carrier system, by various methods of attachment. As carrier systems, films or wafers made of, for example, silicon, silicon alloys such as SiC, SiN, etc., ceramics, (glass-fiber-reinforced) plastics, graphite, sapphire, metals, glasses or composite materials are used. At the end of the back-thinning process and the post-processing, the back-thinned wafers are mounted on film holders, and then the carrier is removed.

Whenever a working of the substrate that goes beyond the back-thinning is necessary, rigid carrier systems, namely carrier substrates, are used. Examples of such working steps after back-thinning are: metallization, dry etching, wet etching, laser processing, lithography, oven processes, doping, etc.

In the case of a rigid carrier substrate, the product substrate that is to be worked is typically connected by an adhesive layer to the carrier substrate.

The carrier substrate is to impart adequate mechanical stability to the substrate that is to be worked in order to be able to be worked in related process steps or process devices. In the case of a temporary connection, target thicknesses are now: between 30 and 100 µm. In the future, thinner product substrates are targeted between 1 µm and 50 µm; in the case of a permanent connection, still thinner product substrates are possible, which are physically limited only by the requirements as regards the height of a transistor with connections. The minimal thicknesses of a product substrate are between 0.001 µm and 5 µm.

Some of the above-mentioned working steps require an exact positioning of the substrates or the carrier within the corresponding devices.

In this case, product substrates with a nominal 300 mm+/−200 µm, for example, are bonded to the carrier substrate with 301 mm+/−200 µm. This is done as a precautionary measure in order to adequately protect, and in particular to support, wafers in the edge areas that are to be back-thinned or that are back-thinned. Because of this measure, the carrier substrate is, however, unattached in the edge area in various working steps, in particular in sputter processes, galvanic deposition and etching processes.

Because of the carrier substrates mentioned in the state of the art, several problems result. Deposition processes, etchings on the edge of the carrier substrate, etc., result in the carrier substrate edge being heavily contaminated.

After detaching from the product substrate, this contaminated edge area must be purified, at great expense in cost and labor. Often, the defective carrier substrate edge is the sole factor that limits the service life of the carrier substrate. The additional costs for an end product follow from, the costs of the carrier substrate, its recycling costs, and the number of reuse cycles. By this previously used process, a purification step of the carrier substrate is very costly. As a result, in many cases, the carrier substrate is not reused.

The more advantageous the carrier substrate, the less critical is a small number of reuse cycles; for example, at least ten reuse processes are desired for carrier substrate production costs of around 20 €.

The more costly the carrier substrate, the more important is its long service life (=large number of reuse cycles). For example, 1,000 reuse processes are desired for carrier substrate production costs of around 2,000 €.

Properties that can make a carrier substrate costly in the first production are, e.g.:
Starting material,
Precise geometry: low TTV (Total Thickness Variation), e.g., <1 µm necessary to be able to smooth and polish the product as precisely as possible to the desired thickness,
Pretreatments that make possible a subsequent detaching of the temporary bond.

Because of these problems, very costly carrier substrates are frequently not used at all, even though they had useful properties for other process steps.

In the process steps cited below, very stringent requirements exist as regards the accuracy of the alignment of two wafers:
In the case of plasma working of back-thinned wafers on carrier substrates, an eccentricity produces an uneven discharge of the plasma. Discharges that are produced (breakdowns because of high electrical field density-arcing) can cause damage to products and plasma process chambers. Special advantages in plasma and sputter processes are achieved because of the possibility of using a carrier substrate that is the same as/smaller than the product substrate.
In the case of lithographic exposure on so-called scanners and steppers, inadequately adjusted bond pairs are not loaded with sufficient accuracy. The referencing (pre-alignment) of the bond pair is done based on the outside contour. The outside contour of a (much) larger carrier substrate, however, does not correspond to the position of the passmarks on the product substrate as long as the adjustment of the two outside contours is not precise, or the outside contour of the product substrate cannot be used. The passmarks are thus not in the "capture range" of the microscope, and a laborious search must be made for them. This leads to losses in time, production throughput and productivity in these systems.

An advantage of this invention is a device and a process for aligning and bringing substrates into contact, wherein a more exact and more efficient alignment and bringing substrates into contact with a carrier substrate is made possible.

This advantage is achieved with the features of the claimed invention. Advantageous further developments of the invention are indicated in the subclaims. Also, all combinations that comprise of at least two of the features indicated in the specification, the claims and/or the figures fall within the scope of the invention. In the indicated ranges of values, values that lie within the above-mentioned limits are also to be disclosed as boundary values and can be claimed in any combination.

SUMMARY OF THE INVENTION

The invention is based on the idea of achieving a more exact alignment by—in particular electronic—detection (detection means) of outside contours of the substrates to be aligned and brought into contact, as well as processing (control means) of the detected outside contours in control signals for alignment (alignment means) of the substrates. According to the invention, the alignment is preferably done continuously when substrates are moved on one another to bring them into contact. Moreover, it is conceivable to examine the alignment accuracy with the same detection means and optionally to perform a renewed alignment.

Substrates are defined as product or carrier substrates used in the semiconductor industry. The carrier substrate serves as an enhancement of the function substrate (product substrate) in the different working steps, in particular during back-thinning of the function substrate. Suitable substrates, in particular wafers, come either with smoothing ("flat") or grooves ("notch").

As an independent invention, a product (or a substrate-carrier substrate combination) is provided, which is comprised of a carrier substrate and a substrate, which have been aligned, brought into contact and prefixed with one another and/or bonded with the device according to the invention and/or the process according to the invention and are distinguished in that the diameter d2 of the carrier substrate is minimally smaller than the diameter d1 of the product substrate. According to the invention, it is thus ensured that the carrier substrate during the processing of the product substrate is exposed to no contamination, fouling or unintentional treatment, etc., whatsoever and therefore can be reused more frequently.

Although the embodiment, according to the invention, is primarily suitable to align a carrier substrate that is smaller as far as the diameter d2 is concerned, relative to a substrate that is larger as far as the diameter d1 is concerned, a device according to the invention can also be used to align carrier substrates toward one another, where the carrier substrates are larger than or the same size as the substrates that are to be bonded.

By the detection means being rotatable relative to the substrate and/or relative to the carrier substrate by rotational means, and/or adjustable parallel to the contact plane relative to the substrate and/or relative to the carrier substrate by an adjustment system in the X- and/or Y-direction, the alignment can be implemented efficiently and precisely.

According to an advantageous embodiment of the invention, the detection means are attached to a carrier unit that is designed in particular to be annular in sections and that can be arranged at least in sections on the peripheral side with respect to the substrate and/or carrier substrate.

Thus, an integration according to the invention of the detection means is possible in an efficient way.

Advantageously, the carrier unit is attached between the carrier substrate holding means and the substrate holding means, in particular with contacting means attached in-between, preferably in the form of a Z-adjustment unit and/or with a base plate attached in-between. In this way, an especially efficient configuration of the invention is provided.

In this case, in further development of the invention, it is advantageous when the adjustment system is attached directly between the base plate and the carrier unit. Thus, a direct action on the carrier unit, together with the substrate holding means attached thereto, is conceivable.

According to another advantageous embodiment of the invention, the peripheral contour and the peripheral contour (both peripheral contours) are detectable at the same time, with the same, one or more, detection means, preferably microscopes. In this way, the number of costly detection means can be reduced without sacrificing speed.

The alignment of a substrate can also be done in a substrate stack as a carrier substrate. In this respect, a substrate stack is defined as an amount of already worked, for example back-thinned, substrates, which are bonded with one another permanently. According to the invention, this substrate stack, when it is thick enough, can serve as a carrier substrate.

The use of a mechanical alignment system (adjustment system and rotation means) is preferred both for the substrate and for the carrier substrate in connection with an optical distance-measuring system. In this respect, it is of special advantage when this alignment system is integrated in a unit for bonding or prefixing the substrates.

The invention thus allows an exact, quick and economical alignment of two substrates (substrate and carrier substrate) with respect to one another, without having to refer to the alignment marks. According to the invention, carrier substrates can therefore dispense with alignment marks, so that the latter can be produced more advantageously.

In addition, because of this invention, repeated use of the carrier substrate is possible, without the latter having to be purified by labor-intensive and costly processes.

Moreover, the possibility arises of incorporating/integrating the device according to the invention in a bonder.

With this invention, the different diameters of the substrates at several points of the periphery (peripheral contours) are taken into consideration, and a more precise positioning is made possible. Such consideration is not possible in the case of other mechanical and/or optical positioning processes. At the same time, a faster alignment than in the case of (purely) mechanical alignment is made possible.

The process underlying the invention and the device according to the invention make possible the necessary accuracies, in particular <50 µm, and in particular to achieve a higher rotational accuracy on the periphery, which is a weak point in the case of previous mechanical processes. Very precise grooves can be assigned on the periphery of the substrate (so-called "notches") of the substrate and carrier substrate.

Advantageously, the grooves are located in such a position that they are detected by at least one detection means. Any detection means whose direction of measurement is parallel or almost parallel to the substrate normal can determine a rotational mis-orientation quickly by the position of the grooves. Similar considerations apply to substrates with flats or any other grooves or deviations from a predetermined ideal geometry of the substrate in question, which can be used for rotational alignment.

The process according to the invention is in particular a dynamic, optical scanning process with software-controlled optimization of the detected/measured data.

In an advantageous embodiment of the invention, the carrier substrate and the function substrate are attached in each case to separate, mechanically movable holding devices (substrate holding means/carrier substrate holding means). In this respect, chucks with vacuum holding devices are provided. Other holding devices, such as adhesive materials, mechanical clamps, or electrostatic holding devices, can be provided. Also, instead of the carrier substrate, production substrates can also be provided. Also, repeatedly bonded or back-thinned multi-layer substrates can be adjusted/aligned with this process.

Advantageously, one of the two substrates is attached on a fastening system (in particular a carrier substrate holding means) that can move in the z-direction. The other substrate is attached on a rotatable chuck (in particular a substrate holding means). The latter is fastened in a mechanical adjustment unit (in particular a carrier unit), which can be adjusted in the x- and y-direction. On/in this mechanical adjustment unit, there are one or more optical scanning units (detection means), which detect(s) (scan(s)) the two substrates, simultaneously, in a narrow band range in the vertical direction. As a result, a gap profile is produced that simultaneously detects/measures the outside geometry (peripheral contours) of the two substrates. This gap profile produces the largest outside diameter of the respective substrate and the distance between the individual substrates and the measuring points or measuring sections.

These scanning units of the detection means advantageously rotate in the mechanical adjustment unit in—or parallel to—the contact plane in order to make possible a detection of several peripheral sections of the peripheral contours of the substrates. By the rotation of the scanning units, it is possible to measure the outside geometry of the two substrates and at the same time to determine the position of the two substrates with respect to one another. The rotation can describe a full circle or else only sectors/detection sections. For less precise adjustment requirements, rotation of the scanning units can be eliminated. It is also possible not to rotate the scanning units, but rather to rotate the two substrates in the case of stationary scanning units.

As an alternative, several scanning units can also be arranged in a stationary manner around the two substrates, in particular at least 3, in order to determine the position and the diameter of the two outside contours (or idealized circles that correspond in software). In this case, a rotation of substrates and/or scanning units can be omitted, and a slight rotation of one substrate relative to the other substrate is sufficient to align the notches or the flats in the rotational direction in the contact plane.

As an alternative, the scanning units can be arranged approximately at right angles to the substrate plane from above or below and can detect the edges of the peripheral contours of the substrates. In a special case, these are microscopes that provide an optical image of the two wafer edges for measurement and evaluation.

One or more of these microscopes can be arranged to be movable according to the invention (rotating around fixed/standing substrates) or stationary (with rotating substrates).

In another special case, at least three microscopes are arranged in a stationary manner on the periphery above and/or below the substrates. Both peripheral edges are visible via the microscopes (optionally by refocusing because of the Z-distance (crosswise to the X- and Y-direction or contact plane), which could exceed the depth of focus. The substrate with the larger diameter, which could obscure the view on the peripheral edge of the smaller substrate, can be moved a certain distance by the alignment means and can thus be made visible and positionable. The image information of the two peripheral edges is converted into a piece of positional information, and the substrates can be aligned precisely with respect to one another.

By software, the necessary calculation of the adjustment paths of the mechanical adjustment elements (alignment means) in the X- and Y-direction as well as the necessary rotation of the substrates can be calculated. This calculation and measurement can be continuously measured and corrected everywhere during the Z-movement (contacting means), i.e., the mechanical engagement of the two substrates.

Because of this online measuring process, it is possible to correct possible deviations during or after the assembly of the substrates or to ensure optimization by separating the units and providing for renewed alignment and bringing into contact.

Because of the device according to the invention and the process according to the invention, it is also possible to align precisely greatly different substrates, such as different diameters or different geometries, for example round substrates with respect to rectangular substrates.

According to a further development of the invention, it is advantageous when the substrate is back-thinned after being brought into contact, whereby the diameter d1 is reduced by the shape of the cross-section of the substrate on its peripheral contour, in particular to $d1 <= d2$. As a result, the simple further processing of the substrate-carrier substrate combination, in particular in known and standardized units, is made possible.

In this case, it is of special advantage when the substrate has an annular shoulder that is produced in particular by providing an edge radius and/or by looping back the peripheral contour. The latter can be produced in a simple way and contributes to the further optimization of the production process according to the invention.

By an annular width dR of the shoulder being larger than or equal to the difference between d1 and d2, the diameter of the substrate can be reduced to the diameter d2 of the carrier wafer or smaller, so that in the further processing, an optimal support of the product substrate is ensured.

According to another advantageous embodiment of the invention, it is provided that during back-thinning, a thickness $D_1$ of the substrate is reduced up to or over the shoulder.

The device according to the invention is further developed wherein the detection means are designed to detect the shape of the cross-section of the substrate on its peripheral contour in such a way that the back-thinning of the substrate can be controlled so that the diameter d1 is reduced, in particular to $d1 <= d2$. By the detection of the shape of the cross-section, a profile of the cross-sectional contour viewed from the side, i.e., along the thickness D1 of the substrate, an exact control of the back-thinning process can be carried out according to the invention.

To the extent that existing device features and/or device features in the following figure description are disclosed, the latter are also to be regarded as disclosed as process features and vice versa.

Further advantages, features and details of the invention follow from the following description of preferred embodiments and based on the drawings.

DETAILED DESCRIPTION OF THE PREFERRED EMBODIMENTS

In the figures, advantages and features of the invention are characterized with these reference numbers that are identified in each case according to embodiments of the invention, whereby components or features with the same function or components or features whose function has the same effect are characterized with identical reference numbers.

The figures show a device and a process, which make it possible to align substrates 2, 5 (or substrate stacks) with respect to one another via peripheral edges $2u$, $5u$. The process according to the invention is a dynamic, optical scanning process with software optimization of the measured data.

Figure 1A:
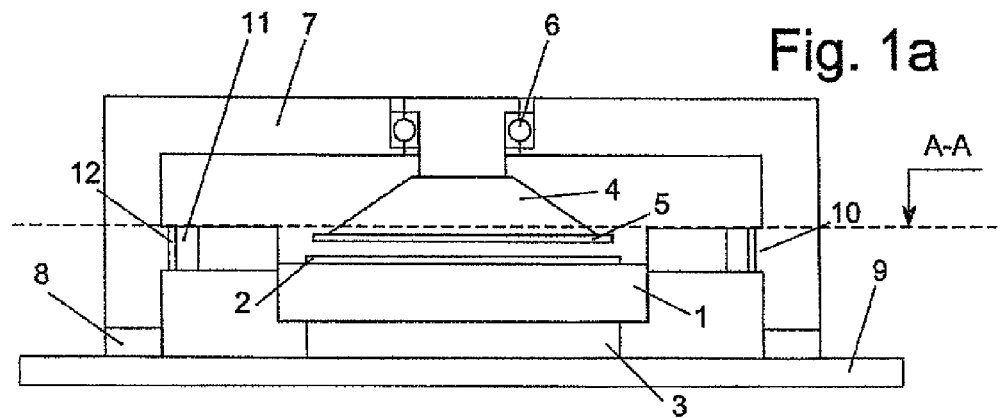
FIG. 1a is a schematic cross-sectional view of a device according to the invention in a first embodiment.
Figure 1B:
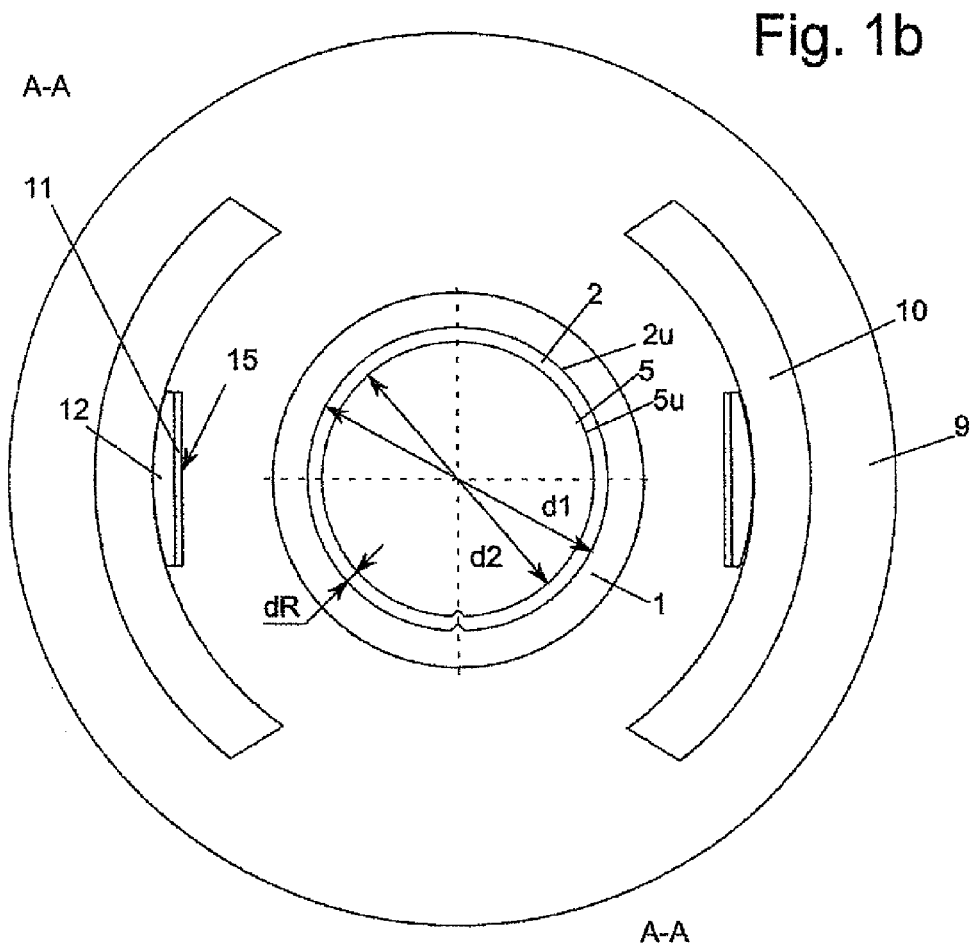
FIG. 1b is a schematic overview of the device according to FIG. 1a, FIG. 2a is a schematic cross-sectional view of a device according to the invention in a second embodiment.

In FIGS. 1a and 1b, a product substrate is attached as substrate 2 to a substrate holding means 1 (chuck). The substrate holding means 1 is adjustable in the Z-direction via an adjustment unit 3 (contacting means), i.e., crosswise to a contact plane between the substrate 2 and a carrier substrate 5.

Above the substrate holding means 1, there is another chuck (carrier substrate holding means 4) with the carrier substrate 5 attached thereto. The carrier substrate holding means 4 is connected to a mechanical unit (carrier unit 7) via a rotational guide (rotational means 6). This mechanical carrier unit 7 is connected to a base plate 9 via guides (adjustment system 8 for adjustment in the X- and Y-direction). This adjustment system 8 makes it possible that the mechanical carrier unit 7 can be moved in the X- and Y-direction, specifically controlled via a control system, not shown.

Technically, the only important thing is producing a relative movement between the substrates 2, 5.

This carrier unit 7 has an annular, preferably circular, guide element 10. A distance-measuring element 11 (detection means) is located on the guide element 10. The detection means are advantageously positioned in the contact plane of the two substrates 2, 5, and all distances are measured/detected at a specific angular range by the distance-measuring element.

As a result, in this scanned angular range, a distance profile is produced that assigns the position of the substrates 2, 5 to the instantaneous position of the scanning unit (detection means).

In the area of the circular guide element 10, the detection means have additional measuring means 12. The measuring means 12 define the precise position of the scanning unit 11 on the periphery of the substrates 2, 5. An evaluation unit of the measuring means 12 is advantageously integrated in the assigned distance-measuring elements. This is advantageous when several distance-measuring elements are used.

In an independent embodiment according to the invention, a carrier substrate 5 is used, which has a slightly smaller diameter d2 than the diameter d1 of the product substrate 2. Thus, the carrier substrate 5, primarily the carrier substrate edge (peripheral edge $5u$) is protected from additional process steps, and the carrier substrate 5 can be used preferably several times without additional purification steps. According to the invention, even very costly and complex carrier substrates 5 can thus be used many times.

If the carrier substrate 5, unlike previous common practice in the semiconductor industry, is not larger but rather smaller (or within the scope of manufacturing tolerances is of equal size) than the product substrate 2, no purification process of the carrier substrate edge $5u$ is required, and the edge area of the carrier substrate 5 remains free of contamination, since the product substrate 2 serves as a cover for the carrier substrate 5 and/or the carrier substrate edge $5u$, and this carrier substrate 5 is not exposed to the effects of the working. The carrier substrate 5 can therefore be reused without a purification step.

The difference between the (mean) diameter d1 of the product substrate 2 and the (mean) diameter d2 of the carrier substrate 5 is less than 500 µm, preferably less than 400 µm, more preferably less than 300 µm, most preferably less than 200 µm, and with utmost preference less than 100 µm.

In the case of product substrate diameters and carrier substrate diameters of the same size and because of manufacturing tolerances, a case can also arise where the diameter d2 of the carrier substrate 5 is minimally (within the manufacturing tolerance) larger than the diameter d1 of the product substrate 2. It is important according to the invention that protection of the carrier substrate edge $5u$ is adequately provided by the shadowing action of the product substrate edge $2u$ of the, in this case, smaller product substrate 2 (not indicated).

In order to achieve the required accuracy of the edge overlap, the edge agreement (edge extension of the product substrate 2) is in particular precise to within 5 µm to 10 µm (concentric). In other words, the distances between the peripheral edges $2u$, $5u$ deviate from one another in the radial direction from the center of the substrates 2, 5 by at most the above-mentioned values.

According to the invention, the carrier substrate 5 is smaller than the product substrate 2 by 0 µm to 500 µm, so that the mechanical support of the mechanically critical edge area $2u$ of the product substrate 2 remains adequate.

For reasons of cost and production throughput, positioning on passmarks within the carrier substrate 5 is preferably not provided. Therefore, all adjustments according to the invention are made between structured product substrate and unstructured carrier substrate according to the substrate edges $2u$, $5u$ of the substrates 2, 5.

Since the substrate edges $2u$, $5u$ of the substrates 2, 5 can be associated with considerable manufacturing tolerances, a precise positioning is especially critical, especially when very precise positionings below 20 µm are required.

Therefore, accuracies according to the invention of +/−5 µm to +/−20 µm and rotational accuracies of +/−5/10 µm equivalent on the notch (if present on the carrier substrate) or on the flat are required.

The carrier substrate holding means 4 is mounted to rotate by the rotational means 6 and is connected via the carrier unit 7 to the adjustment system 8, which makes possible a translational movement of the carrier unit 7 and thus the carrier substrate holding means 4. One (or more) optical scanning unit(s) 15, 15' are located in the carrier unit 7.

The scanning unit 15, 15' is able to detect, in particular to scan, the peripheral contours $2u$, $5u$ of the two substrates 2, 5 at least in sections. The distance-measuring system 11 allows the continuous determination of the distance from the distance-measuring system 11 to the peripheral contours 2*u*, 5*u*.

As a result, a gap profile is produced, which simultaneously measures/detects the outside geometry of the two substrates 2, 5. This gap profile produces both the largest outside diameter of the respective substrate 2, 5 and the distance from the peripheral contours 2*u*, 5*u* of the individual substrates 2, 5 with respect to one another. The scanning units 15, 15' preferably rotate along the guide elements 10 in the mechanical device.

Because of the rotation of the scanning units 15, 15', it is possible to measure the substrate edges 2*u*, 5*u* of the two substrates 2, 5 and at the same time to determine the position of the two substrates 2, 5 relative to one another. The scanning units 15, 15' can move along a closed circle if the guide 10 is closed, or only along circular segments 10, as shown in the embodiment in FIG. 1*b*. For fewer precise adjustment requirements, the rotation of the scanning units 15, 15' can be eliminated. It is also possible not to rotate the scanning units 15, 15' but rather to rotate the two substrates 2, 5 in the case of stationary scanning units 15, 15', by corresponding contacting means 3 having rotational units.

Figure 2A:
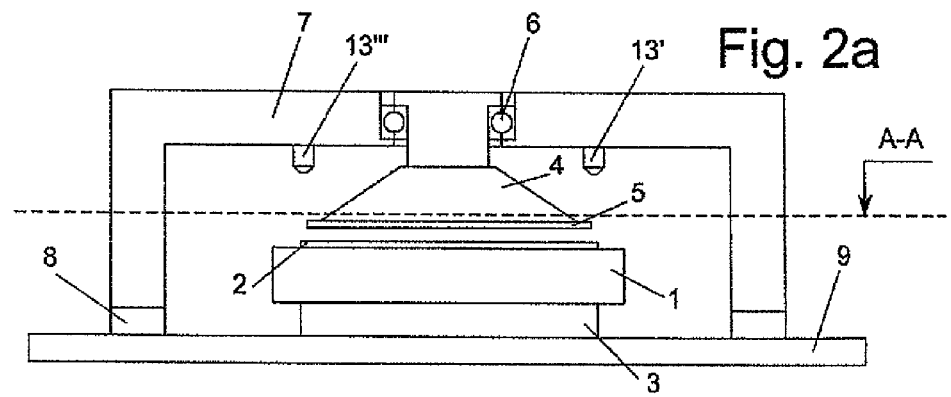
FIG. 2b is a schematic overview of the device according to FIG. 2a, FIG. 3a is a schematic cross-sectional view of a process step of an embodiment of a product according to the invention (substrate-carrier substrate combination) before the bonding step.
Figure 2B:
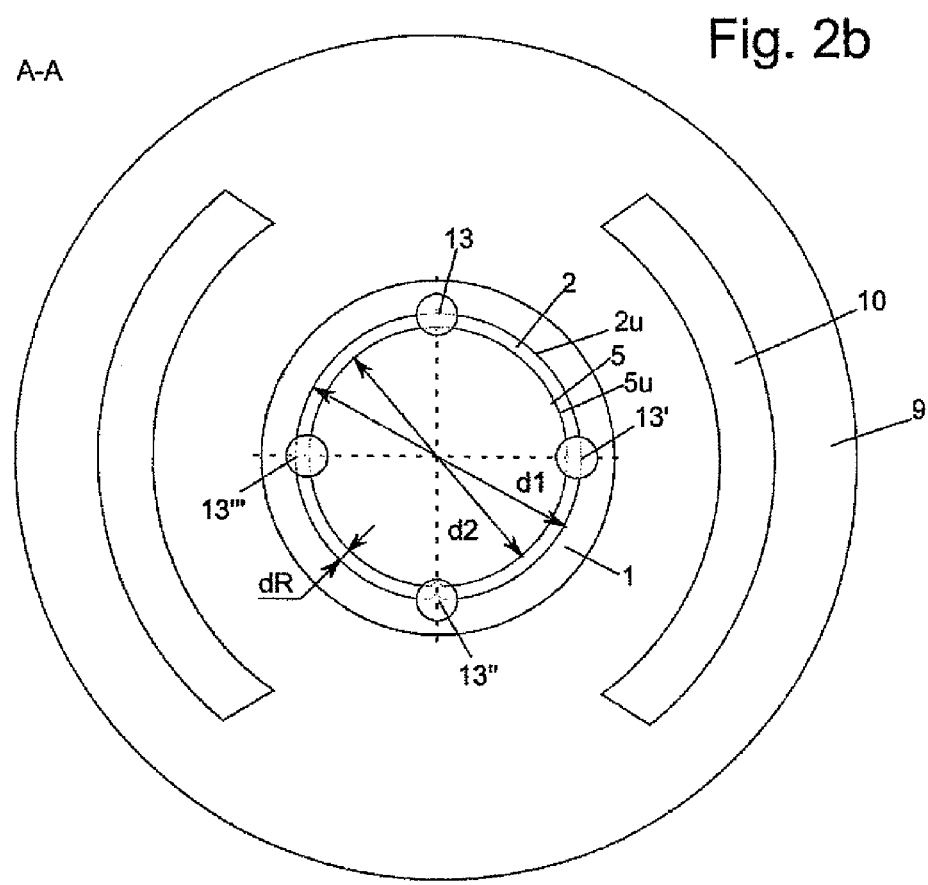

In the embodiment according to FIGS. 2*a* and 2*b*, the scanning units can be optics 13, 13', 13", 13''', whose optical axes are approximately at right angles to the substrate surface of the substrate 2. In one embodiment, the scanning units are microscopes that supply an optical image of the substrate edges and thus the peripheral contours 2*u*, 5*u* for measuring and evaluation.

One or more of these optics 13, 13', 13", 13''' can in turn be arranged to be movable (rotating around the standing substrates 2, 5) or stationary (with rotating substrates 2, 5).

In another embodiment, at least four optics 13, 13', 13", 13''' are arranged in a stationary manner on the periphery above and/or below the substrates 2, 5. Both substrate edges 2*u*, 5*u* are visible through the optics 13, 13', 13", 13''' (optionally with refocusing because of the Z-distance, which could exceed the depth of focus).

In this embodiment, it is advantageous when the carrier substrate 5 lies with the lower diameter d2 in the optical path between the optics 13, 13', 13", 13''' and the substrate 2 with the larger diameter d1, so that for the optics 13, 13', 13", 13''', both peripheral contours 2*u*, 5*u* with corresponding alignment of the two substrates 2, 5 with respect to one another are visible at the same time.

Should the optics be sensitive to an electromagnetic irradiation, for which the substrates that are used are transparent, the substrate 2 with the larger diameter d1 can also be located closer to the respective optics. By way of example, silicon wafers that are transparent to infrared radiation can be mentioned.

Mathematically, the adjustment of the two substrates 2, 5 with respect to one another can be done based on any adjustment calculation, preferably by the least squares method. The optics or distance-measuring systems are preferably to be designed in such a way that the recorded data are digitized and can be forwarded to a corresponding computer.

Corresponding software in the computer (control system) is able to control the X- and/or Y- and/or rotational units in such a way that a continuous matching of the alignment of the two peripheral contours 2*u*, 5*u* with respect to one another is carried out specifically until the corresponding adjustment calculation of the software yields a parameter that is a measurement of the accuracy of the adjustment calculation, which value drops below a threshold value specified by the user.

Figure 3A:
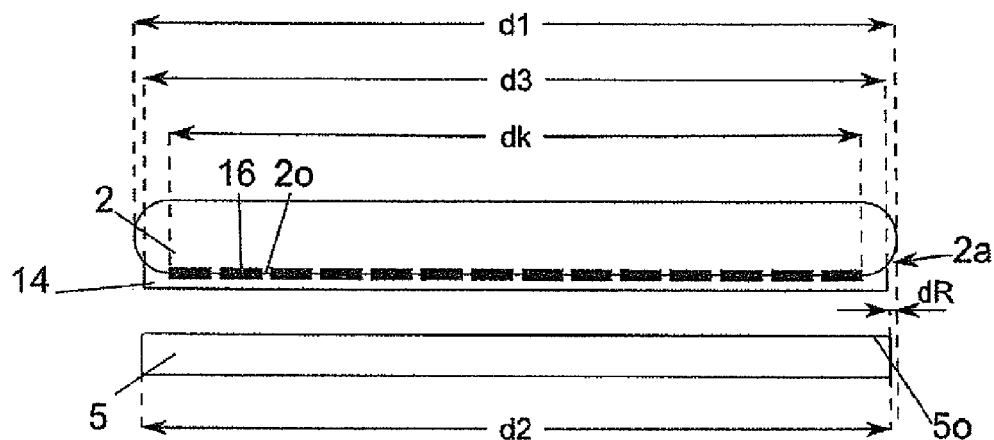
FIG. 3b is a schematic cross-sectional view of a process step of an embodiment of a product according to the invention after the bonding step.
FIG. 3c is a schematic cross-sectional view of a process step of an embodiment of a product according to the invention after the back-thinning.
Figure 3B:
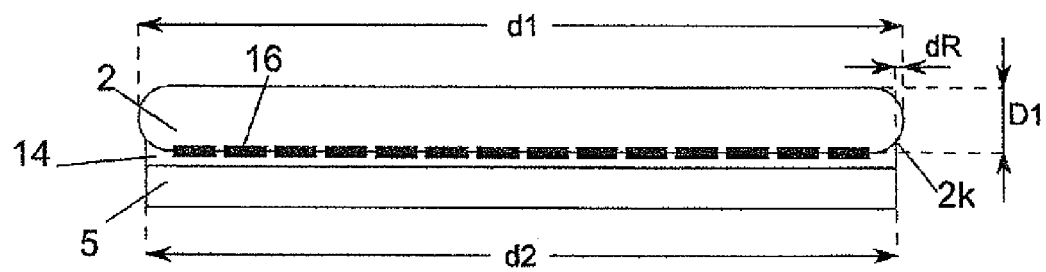
Figure 3C:
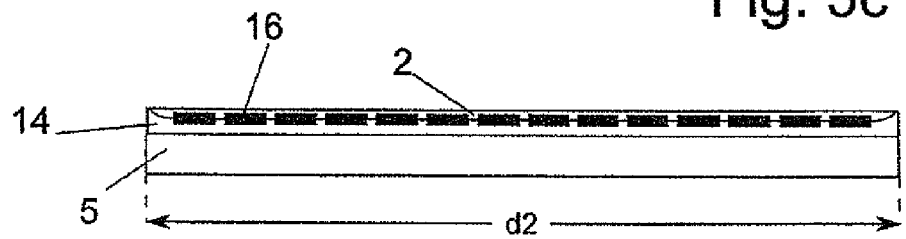

FIGS. 3*a*-3*b* show a shortened process for the production of a product according to the invention (substrate-carrier substrate combination) with the carrier substrate 5, whose diameter d2—at least before the back-thinning process (FIGS. 3*a*-3*b*)—is smaller than the diameter d1 of the substrate 2. After an alignment and bonding process according to the invention (FIG. 3*b*), a back-thinning process of the substrate 2 (FIG. 3*c*) is carried out.

The substrate 2 is connected to the carrier substrate 5 by an adhesive layer 14, which is attached to the substrate 2 before the bonding, in particular to an adhesive surface with a diameter d3, which is between the diameter d2 of the carrier substrate 5 and the diameter d1 of the substrate 2, and preferably corresponds to the diameter d2 of the carrier substrate 5.

In the embodiment according to FIG. 3, the carrier substrate 5 has a very small edge radius, while the substrate 2 has a very large edge radius. In the embodiment according to the invention, two advantages are thus obtained. First, the relatively small edge radius of the carrier substrate 5 contributes to the fact that a support surface 5*o* supporting the substrate 2 after incorporation on the carrier substrate 5 as much as possible reaches a support edge 2*k* of the peripheral contour 2*u*, which has the result of an advantageous support of the product substrate 2 by the carrier substrate 5. The adhesive layer 14 does not have a significant effect on the support; in particular, the latter has at least the diameter d3 that is equal to the diameter d2 of the carrier substrate 5.

Because of the edge radius, the substrate 2 has an annular shoulder 2*a* on its peripheral contour at least on the contact side of the substrate 2 with the carrier substrate 5, and said shoulder has an annular width dR that corresponds to at least the difference between the diameters d2 and d1. The shoulder 2*a* is distinguished in this embodiment by continuous reduction of the thickness $D_1$ of the substrate 2 in the direction of the peripheral contour 2*u* and/or by continuous reduction of the diameter of (at most) the mean diameter d1 up to a diameter dk on the contact side 2*o*. The shoulder 2*a* can be defined in particular by the adhesive layer 14, in particular by a diameter d3 of the adhesive layer 14.

In addition, the relatively large edge radius of the product substrate 2 makes it possible that the diameter d1 of the product substrate 2 by itself is matched to the diameter d2 of the carrier substrate 5 by the back-thinning and the shape of the cross-section of the peripheral contour 2*u* by the looping-back being carried out up to at least the shoulder 2*a*. After an alignment and bonding process according to the invention (FIG. 3*b*), a back-thinning process of the substrate 2 (FIG. 3*c*) is carried out at least to above the shoulder of the peripheral contour 2*u*, i.e., at least up to the shoulder 2*a'*.

It would also be conceivable that the edge radius of the product substrate 2 is very small, which would increase the usable surface of the product substrate 2, primarily in the case of very large wafers, and thus would increase the yield of functional units, for example chips, 16, provided on the product substrate 2.

Figure 4A:
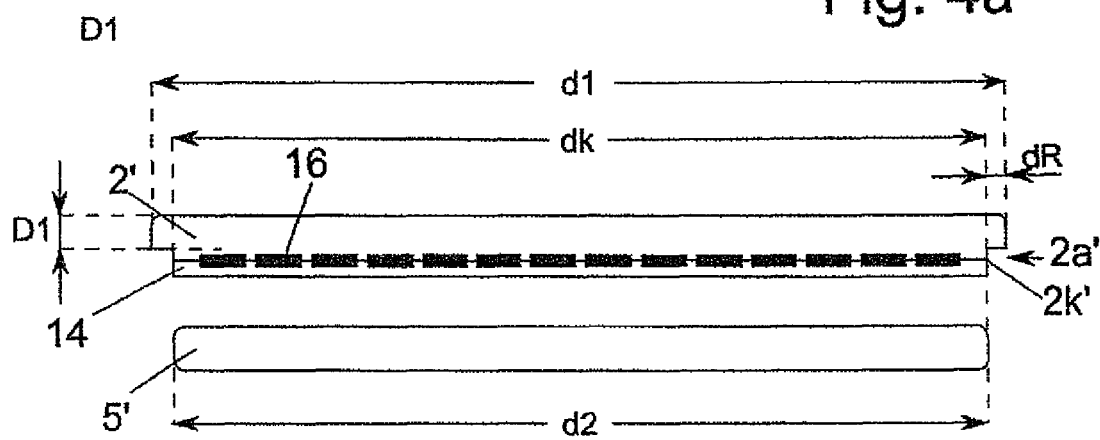
FIG. 4a is a schematic cross-sectional view of a process step of an embodiment of a product according to the invention before the bonding step.
Figure 4B:
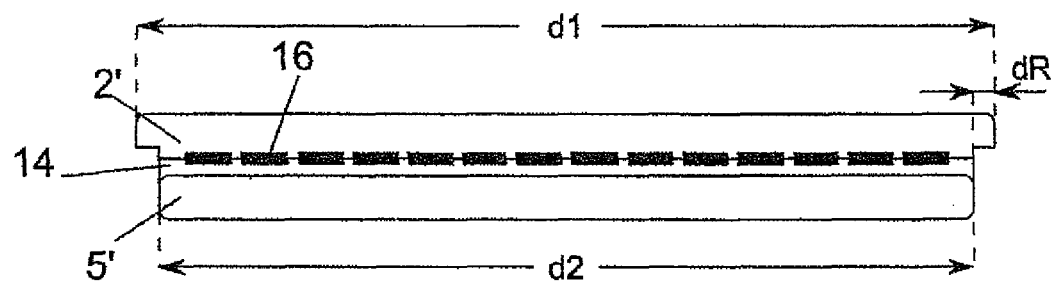
FIG. 4b is a schematic cross-sectional view of a process step of an embodiment of a product according to the invention after the bonding step.

FIGS. 4*a*-4*b* show another shortened process of a product according to the invention (substrate-carrier substrate combination) with a carrier wafer 5', whose diameter d2 is smaller than the diameter d1 of a substrate 2'. The edge of the (product) substrate 2' was looped back according to the invention on the peripheral contour 2*u* by an annular width dR to achieve an effect similar to the effect of the larger edge radius in the embodiment according to FIGS. 3*a* to 3*c*. In this connection, an annular shoulder 2a is produced. The looping-back is produced in particular by a process that is known in the industry under the name "edge-trimming."

Figure 4C:
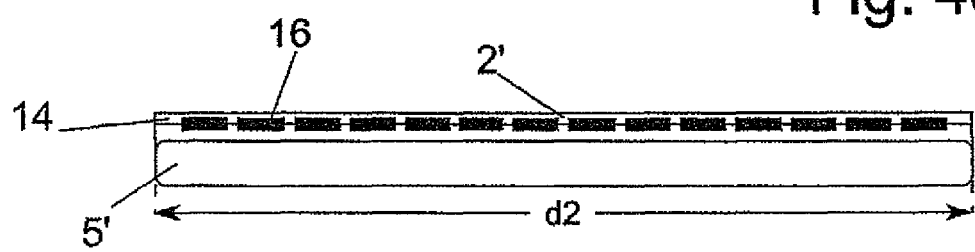
FIG. 4c is a schematic cross-sectional view of a process step of an embodiment of a product according to the invention after the back-thinning.

The diameter d2 of the carrier wafer 5' advantageously equals the diameter d1 of the substrate 2 reduced by the annular width dR of the circular ring. After an alignment and bonding process according to the invention (FIG. 4b), a back-thinning process of the substrate 2' is carried out (FIG. 4c) at least up to the looped-back section of the peripheral contour 2u, i.e., at least up to the shoulder 2a'.

Both products according to the invention have the property that after the back-thinning, the diameter d2 of the carrier wafer 5, 5' and the diameter d1 of the substrate 2, 2' have a smaller difference, approximately equal, or the diameter d1 is even smaller than the diameter d2, by the back-thinning process resulting in a reduction of the diameter d1 of the substrate 2, 2' because of the edge shape of the substrate 2, 2'.

The edge shapes of the substrates are determined by SEMI standards. There are substrates with different edge profiles provided for special objects. These edge profiles are produced by special machines. The shape of the edges is of importance for the chip yield. To be able to process as many chips as possible on a substrate, chips must also be produced on the outermost edge areas. Therefore, it is useful according to the invention to make the edge geometry as square as possible, or at least rounded with the smallest possible radius of curvature. As a result, preferably a wafer is produced with as large an area of use as possible.

The different wafer edge profiles are defined in the SEMI standard. The different wafer edge profiles can adopt very complicated shapes and are described in the rarest cases by a single parameter. According to the invention, the edge radius is defined as a parameter that results in a significant rounding of the wafer edge profile.

For an embodiment according to the invention, in which the product wafer is to have as many functional units as possible, the characteristic edge radius is less than 1 mm, preferably less than 0.5 m, more preferably less than 0.1 mm, most preferably less than 0.001 mm, and with utmost preference equal to 0 mm.

For an embodiment according to the invention in which the product wafer is reduced in its thickness by processes after the bonding process, the calculation of the characteristic edge radius has to be carried out based on the end thickness of the product wafer or the diameter of the carrier substrate and/or product substrate. The characteristic edge radius is larger than 0 mm, preferably larger than 0.001 mm, more preferably larger than 0.1 mm, most preferably larger than 0.5 mm, and with utmost preference larger than 1 mm.

For an embodiment according to the invention, in which the carrier wafer is optimally to support the product wafer by as large a surface as possible, the characteristic edge radius of the carrier wafer is smaller than 1 mm, preferably smaller than 0.5 mm, more preferably smaller than 0.1 mm, most preferably smaller than 0.001 mm, and with utmost preference equal to 0 mm.

REFERENCE SYMBOL LIST

1 Substrate Holding Means
2, 2' Substrate
2o Contact Side
2a, 2a' Shoulder
2k, 2k' Support Edge
3 Contacting Means
4 Carrier Substrate Holding Means
5, 5k' Carrier Substrate
2u, 5u Peripheral Contours
5o Support Surface
6 Rotational Means
7 Carrier Unit
8 Adjustment System
9 Base Plate
10 Guide Elements
11 Distance-Measuring Elements
12 Measuring Means
13, 13', 13", 13''' Optics
14 Adhesive Layer
15, 15' Scanning Unit
16 Functional Units
d1, d2, d3, dk Mean Diameter
dR Mean Annular Width
$D_1$ Thickness Having described the invention, the following is claimed:

1. A device for aligning a large-area substrate with a carrier substrate and bringing the large-area substrate into contact with the carrier substrate for the further processing of the large-area substrate, said device comprising:
   a substrate holding means configured to attach the large-area substrate thereto;
   a carrier substrate holding means configured to attach the carrier substrate thereto;
   detection means positioned in a contact plane of the large-area substrate with the carrier substrate, the detection means being configured to detect, relative to the contact plane, a peripheral contour of the attached large-area substrate and a peripheral contour of the attached carrier substrate;
   an alignment system configured to align the large-area substrate relative to the carrier substrate;
   controlling means configured to control the alignment system based on the detected peripheral contours; and
   contacting means configured to bring the large-area substrate, aligned relative to the carrier substrate, into contact with the carrier substrate,
   wherein the alignment system and the contacting means are further configured to continuously align the large-area substrate relative to the carrier substrate until the large-area substrate is brought into contact with the carrier substrate.

2. The device according to claim 1, wherein the alignment system further comprises at least one of:
   a rotational guide configured to rotate the detection means relative to at least one of the large-area substrate and the carrier substrate; and
   an adjustment system configured to adjust the detection means relative to at least one of the large-area substrate and the carrier substrate in at least one of an X-direction parallel to the contact plane and a Y-direction parallel to the contact plane.

3. The device according to claim 1, wherein the detection means is attached to a carrier unit that is annular in sections and that can be arranged at least in sections in the contact plane.

4. The device according to claim 3, wherein the contacting means comprises an adjustment unit configured to adjust the substrate holding means in a Z-direction, and
   wherein the carrier unit is attached between the carrier substrate holding means and the substrate holding means with the adjustment unit being attached at least one of there between and with a base plate attached in-between.

5. The device according to claim 4, wherein the alignment system further comprises an adjustment system configured to adjust the detection means relative to at least one of the large-area substrate and the carrier substrate in at least one of an X-direction parallel to the contact plane and a Y-direction parallel to the contact plane, the adjustment system being attached directly between the base plate and the carrier unit.

6. The device according to claim 1, wherein the detection means operates electromagnetically, and
wherein the peripheral contour of the large-area substrate and the peripheral contour of the carrier substrate are detected simultaneously.

7. The device according to claim 1, wherein the detection means is positioned opposite the peripheral contours of the large-area substrate and the carrier substrate.

8. A process for aligning a large-area substrate with a carrier substrate and bringing the large-area substrate into contact with the carrier substrate for the further processing of the large-area substrate, the process comprising:
attaching the large-area substrate to a substrate holding chuck;
attaching the carrier substrate to a carrier substrate holding chuck;
detecting, relative to a contact plane of the large-area substrate with the carrier substrate, a peripheral contour of the attached large-area substrate and a peripheral contour of the attached carrier substrate, the detecting being performed by a distance-measuring system positioned in the contact plane;
aligning the large-area substrate relative to the carrier substrate via a mechanical alignment system;
controlling the aligning based on the detected peripheral contours via a control system; and
bringing the large-area substrate, aligned relative to the carrier substrate, into contact with the carrier substrate via a Z-direction adjustment unit,
wherein the large-area substrate is continuously aligned relative to the carrier substrate until the large-areas substrate is brought into contact with the carrier substrate.

9. The process according to claim 8, wherein the detecting comprises at least one of:
rotating the distance-measuring system relative to at least one of the large-area substrate and the carrier substrate via a rotational guide of the alignment system; and
adjusting, via an adjustment system of the alignment system, the distance-measuring system relative to at least one of the large-area substrate and the carrier substrate in at least one of an X-direction parallel to the contact plane and a Y direction parallel to the contact plane.

10. The process according to claim 8 or 9, wherein the distance-measuring system operates electromagnetically, and
wherein the peripheral contour of the large-area substrate and the peripheral contour of the carrier substrate are detected simultaneously.

11. The process according to claim 8 or 9, wherein the detection of the peripheral contours is carried out sequentially by the rotating the distance-measuring system relative to at least one of the large-area substrate and the carrier substrate.

12. The process according to claim 9, wherein the peripheral contours of the large-area substrate and carrier substrate are aligned equidistant or concentric with respect to one another with a gap deviation of less than 50 μm.

13. The process according to claim 8 or 9, wherein the controlling of the aligning completes when a value drops below a determinable threshold value for the gap deviations.

14. The process according to claim 8, wherein the large-area substrate has a mean diameter d1 and the carrier substrate has a mean diameter d2,
wherein the mean diameter d1 is greater than the mean diameter d2.

15. The process according to claim 14, wherein the mean diameter d1 is 500 μm greater than the mean diameter d2.

* * * * *